(12) United States Patent
Okayasu

(10) Patent No.: US 6,469,514 B2
(45) Date of Patent: Oct. 22, 2002

(54) TIMING CALIBRATION APPARATUS AND METHOD IN A SEMICONDUCTOR INTEGRATED CIRCUIT TESTER

(75) Inventor: Toshiyuki Okayasu, Tokyo (JP)

(73) Assignee: Advantest Corporation, Tokyo (JP)

( * ) Notice: Subject to any disclaimer, the term of this patent is extended or adjusted under 35 U.S.C. 154(b) by 14 days.

(21) Appl. No.: 09/825,610

(22) Filed: Apr. 3, 2001

(65) Prior Publication Data

US 2001/0028251 A1 Oct. 11, 2001

(30) Foreign Application Priority Data

Apr. 4, 2000 (JP) ........................................ 2000/102461

(51) Int. Cl.[7] .................... G01R 31/08; G01R 31/26; G01R 31/02; G01R 1/04; G01R 11/32
(52) U.S. Cl. ................... 324/532; 324/765; 324/158.1; 324/73.1; 324/763; 324/74
(58) Field of Search ................................ 324/532, 765, 324/158.1, 73.1, 763, 74, 130, 537; 714/700, 726, 733, 724

(56) References Cited

U.S. PATENT DOCUMENTS

| | | | | |
|---|---|---|---|---|
| 4,354,269 A | * | 10/1982 | Michel et al. | 714/724 |
| 4,799,008 A | * | 1/1989 | Kannari | 324/74 |
| 4,928,278 A | * | 5/1990 | Otsuji et al. | 714/700 |
| 5,231,314 A | * | 7/1993 | Andrews | 327/153 |
| 5,262,716 A | * | 11/1993 | Gregory, Jr. et al. | 324/754 |
| 5,821,529 A | * | 10/1998 | Chihara et al. | 250/214.1 |
| 6,060,898 A | * | 5/2000 | Arkin | 324/765 |
| 6,133,725 A | * | 10/2000 | Bowhers | 714/158.1 |
| 6,331,783 B1 | * | 12/2001 | Hauptman | 324/765 |
| 6,396,856 B1 | * | 5/2002 | Sucha et al. | 372/25 |

FOREIGN PATENT DOCUMENTS

JP   2000352578   * 12/2000   ......... G01R/31/319

* cited by examiner

Primary Examiner—N. Le
Assistant Examiner—Wasseem H. Hamdan
(74) Attorney, Agent, or Firm—David N. Lathrop, Esq.; Gallagher & Lathrop

(57) ABSTRACT

There are provided a timing calibration apparatus and a timing calibration method capable of carrying out the calibration of timing on an IC tester with high accuracy. There is provided a probe to be sequentially contacted with pins of an IC socket on which an IC under test is to be mounted, and a calibration pulse supplied to the IC socket from the IC tester is taken in the probe. The calibration pulse is compared with the reference timing, thereby to calibrate the timing on a driver included signal path. In the probe a calibration pulse is generated, which is sequentially supplied to the pins of the IC socket, thereby to calibrate the timing on a comparator included signal path in each of channels. There are provided in the probe an optical modulator for converting an electric signal into an optical signal and an optically driven type driver. An optical cable couples between a calibration controller provided in the IC tester and the probe.

9 Claims, 10 Drawing Sheets

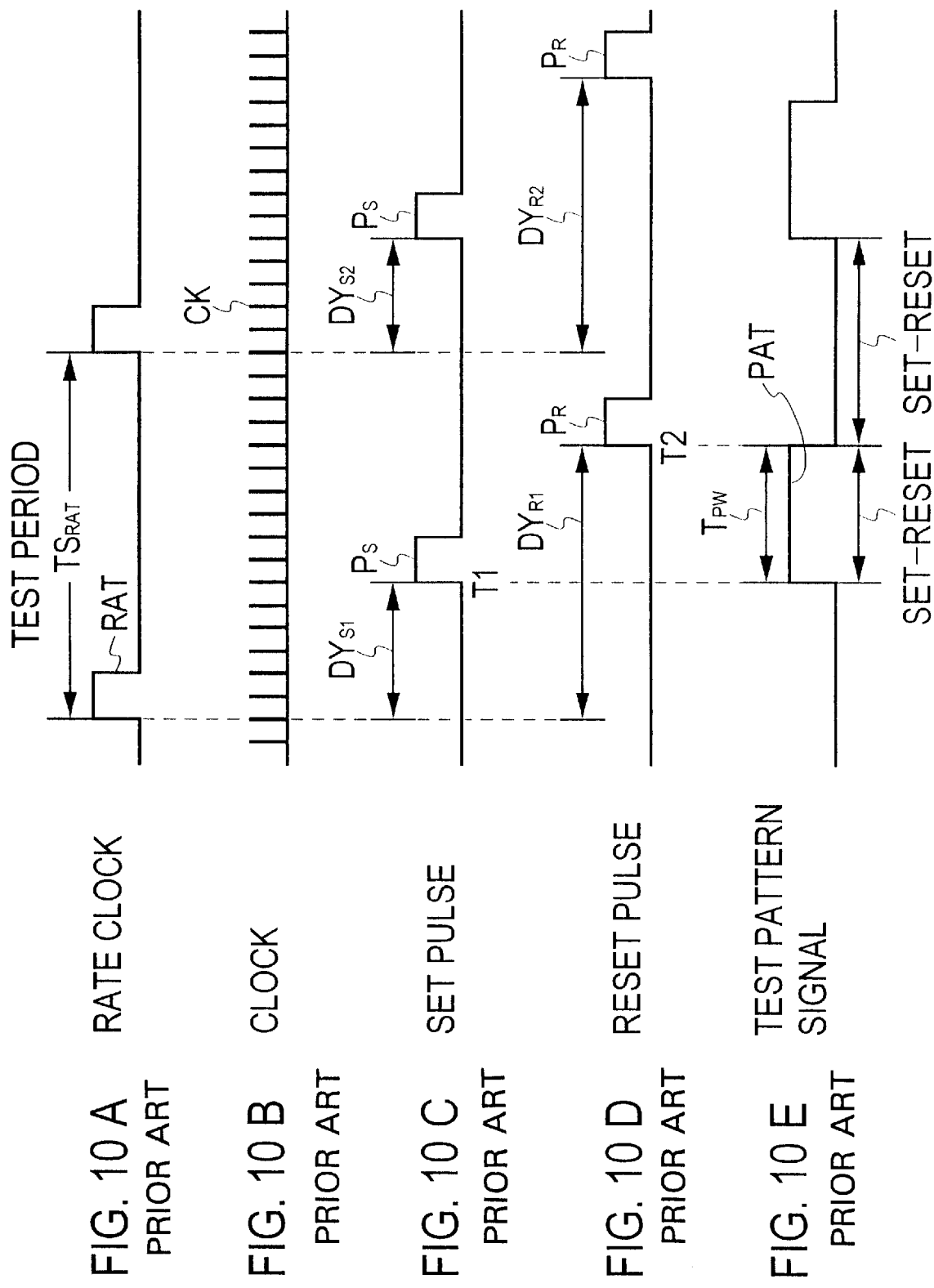
FIG. 10 A PRIOR ART   RATE CLOCK
FIG. 10 B PRIOR ART   CLOCK
FIG. 10 C PRIOR ART   SET PULSE
FIG. 10 D PRIOR ART   RESET PULSE
FIG. 10 E PRIOR ART   TEST PATTERN SIGNAL

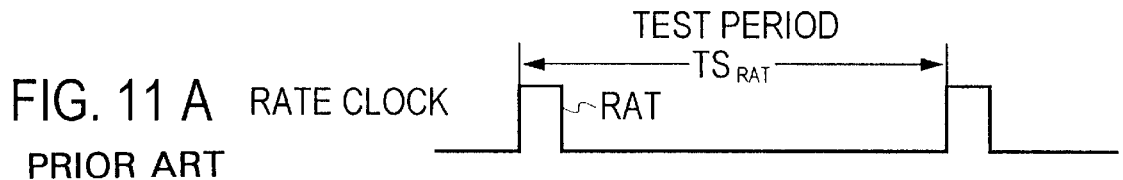
FIG. 11 A RATE CLOCK
PRIOR ART
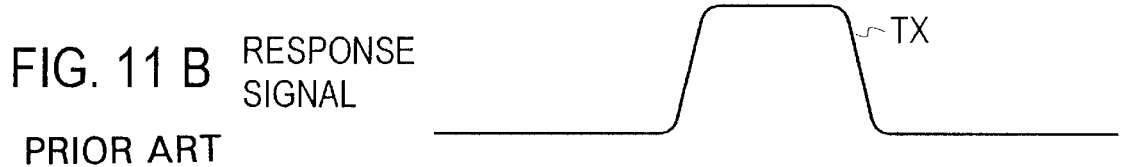
FIG. 11 B RESPONSE SIGNAL
PRIOR ART
FIG. 11 C STROBE PULSE
PRIOR ART
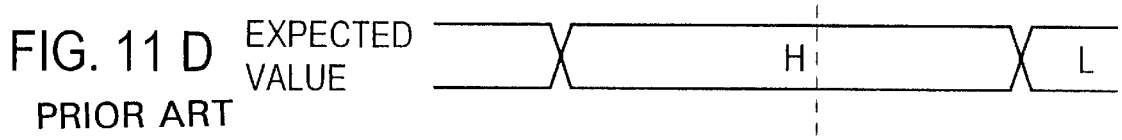
FIG. 11 D EXPECTED VALUE
PRIOR ART
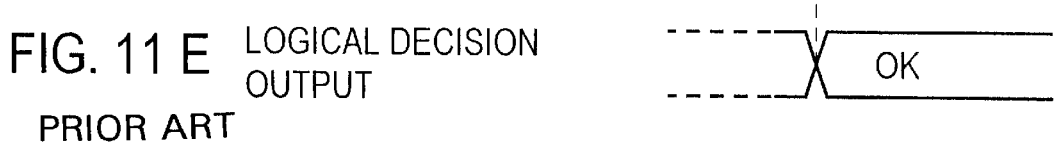
FIG. 11 E LOGICAL DECISION OUTPUT
PRIOR ART

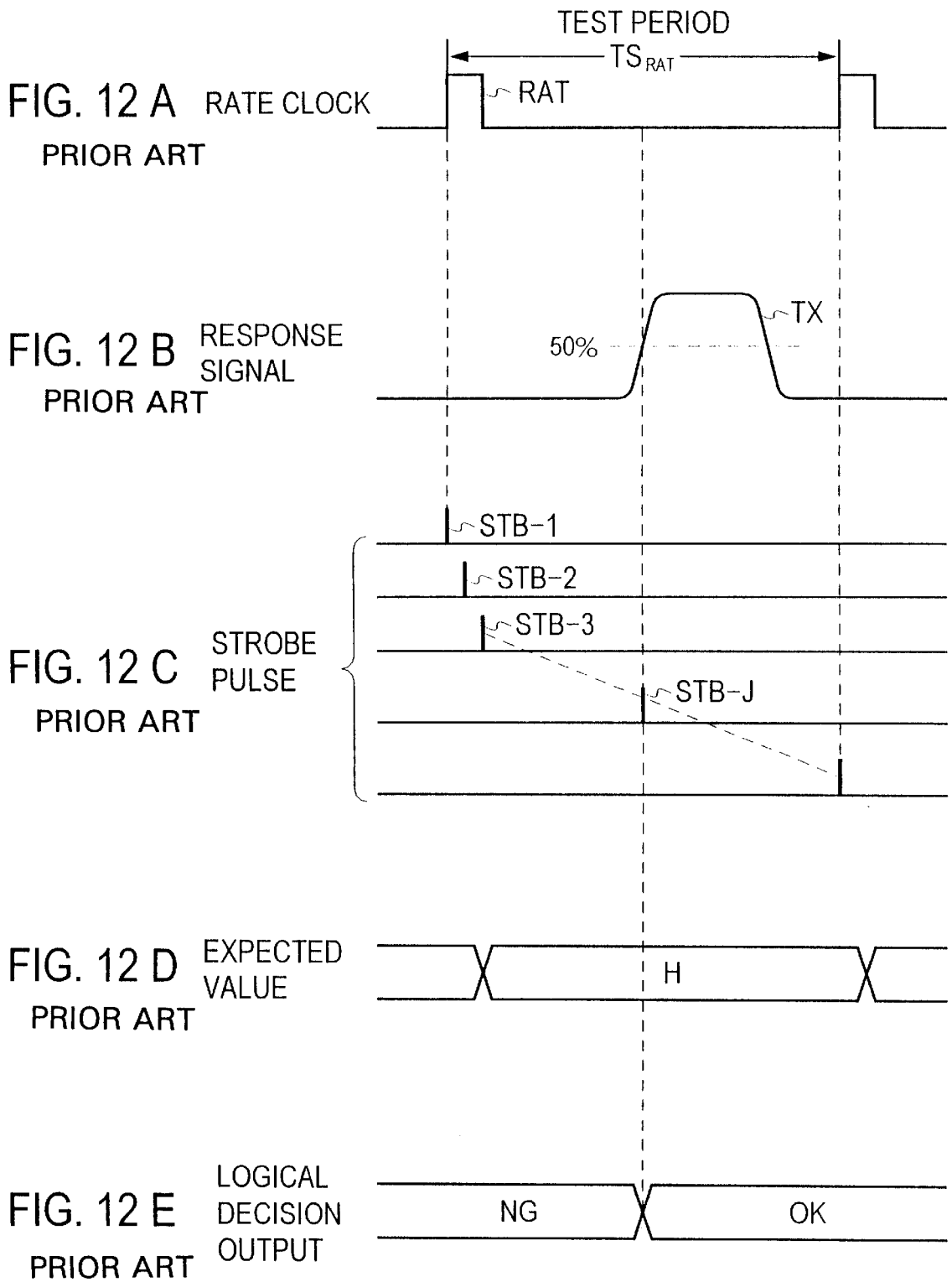

TIMING CALIBRATION APPARATUS AND METHOD IN A SEMICONDUCTOR INTEGRATED CIRCUIT TESTER

BACKGROUND OF THE INVENTION

1. Field of the Invention

The present invention relates to a semiconductor integrated circuit tester for testing a semiconductor integrated circuit (hereinafter, referred to as IC) including a memory or the like, and for determining whether the tested IC is a defective (failure) article or not, and more particularly, relates to a timing calibration apparatus and a timing calibration method in such an IC tester each being capable of conforming the timing at which a test pattern signal is applied to each of terminals of an IC under test and the timing at which a response signal outputted from each of terminals of the IC under test is fetched into or read in the IC tester, to a prescribed set value for each terminal.

2. Description of the Related Art

In an IC tester heretofore in use, there have been carried out a timing calibration for conforming the phase of a test pattern signal applied to each terminal (also called "pin") of an IC under test (the timing at which the test pattern signal is applied to each terminal) with each other and a timing calibration for conforming the phase of a response signal when the response signal outputted from each terminal of the IC under test is fetched into or read in the IC tester (the timing at which the response signal is fetched into the IC tester) with each other.

As a calibration method of timing, there has been used a method in which a variable delay circuit previously inserted in the signal path or line for each terminal of the IC under test is adjusted in its delay time thereby to conform the delay time of each signal path with each other.

The following two methods are put to practical use as a method for measuring the delay time of a signal path or line, which will be explained.

(1) A method comprising the steps of: measuring a reflection time of a signal propagating through a signal path or line by utilization of a timing measuring function that the IC tester has; and measuring a propagation delay time of the signal path on the basis of the reflection time of the signal.

(2) A method comprising the steps of: bringing a probe into contact with each of terminals (pins) of an IC socket to which an IC under test is mounted when it is tested; supplying a calibration pulse having applied to each terminal of the IC socket to an oscilloscope through the probe; measuring the phase difference between the calibration pulse and a signal having the reference phase in the oscilloscope; and measuring a propagation delay time of the signal path through which the calibration pulse has propagated on the basis of the phase difference.

In case of using the measuring method (1) mentioned above, the reflected wave of the calibration pulse has an inferior quality in its waveform, and hence the accuracy of detecting the arrival of the reflection wave is deteriorated. Accordingly, there is a drawback that the calibration accuracy of timing is also lowered.

In the above-mentioned measuring method (2), since the phase difference between the signal to be measured and the reference signal is measured by the oscilloscope, the measuring accuracy is high. Accordingly, there is an advantage that the calibration of timing can be carried out with high accuracy. However, in case of using the above measuring method (2), the signal path that its timing calibration can be done by use of the measuring method (2) is limited to a signal path or line having a driver inserted therein which is capable of supplying a test pattern signal to an IC socket (hereinafter, referred to as driver included signal path), and a signal path or line through which a response signal outputted from an IC under test is propagated to a comparator (a signal path not including a driver) is excluded from a subject to be measured. Therefore, the signal path through which a response signal outputted from an IC under test is propagated (hereinafter, referred to as comparator included signal path) must be measured in its propagation delay time by using the above-mentioned measuring method (1) utilizing the reflected wave of the calibration pulse. As a result, in case of using the above measuring method (2), though the calibration accuracy of timing on the driver included signal path becomes high, the calibration accuracy of timing on the comparator included signal path remains inferior, and hence there is a drawback that the calibration accuracy of timing is deteriorated as a whole.

Moreover, in the above measuring method (2), an oscilloscope must be provided, which is entirely unnecessary in testing an IC. An oscilloscope is very expensive among others, which is constructed such that it has the accuracy and measurement band or range capable of measuring a signal from an IC tester, is of two input type and automatically measures the phase difference between two signals, and outputs data corresponding to the phase difference. Accordingly, a high expensive oscilloscope must be provided for only calibration of timing, which results in a drawback that an economic or financial defrayal is increased.

SUMMARY OF THE INVENTION

It is a first object of the present invention to provide a timing calibration apparatus and a timing calibration method in an IC tester each being capable of carrying out a calibration of timing on either a driver included signal path or a comparator included signal path with high accuracy by utilizing an optical pulse.

It is a second object of the present invention to provide a timing calibration apparatus and a timing calibration method in an IC tester each being capable of reducing the cost required to carry out a calibration of timing on any signal path.

In order to accomplish the aforesaid objects, there is provided, in a first aspect of the present invention, a timing calibration apparatus in an IC tester, the IC tester comprising: an IC socket on which an IC under test is to be mounted; signal paths including drivers respectively, each applying a calibration pulse to the IC socket; a probe to be sequentially contacted with terminals of the IC socket to take therein a calibration pulse applied to the IC socket; signal paths including comparating means respectively, each being connected with corresponding one of the terminals of the IC socket and being supplied through the IC socket with a calibration pulse having the reference phase generated from the probe; and timing calibration means for conforming a signal propagation time on each of the driver included signal paths to the reference value as well as conforming the applied timing of each of strobe pulses given to the comparating means to the predetermined reference phase of the calibration pulse, the timing calibration apparatus comprising: an optically driven type driver provided in the probe; and an optical drive signal supply means provided in the IC tester for supplying an optical drive signal to the optically driven type driver to generate the calibration pulse having the reference phase from the optically driven type driver.

In a second aspect of the present invention, there is provided a timing calibration apparatus in an IC tester, the IC tester comprising: an IC socket on which an IC under test is to be mounted; signal paths including drivers respectively, each applying a calibration pulse to the IC socket; a probe to be sequentially contacted with terminals of the IC socket. to take therein a calibration pulse applied to the IC socket; signal paths including comparating means respectively, each being connected with corresponding one of the terminals of the IC socket and being supplied through the IC socket with a calibration pulse having the reference phase generated from the probe; and timing calibration means for conforming a signal propagation time on each of the driver included signal paths to the reference value as well as conforming the applied timing of each of strobe pulses given to the comparating means to the predetermined reference phase of the calibration pulse, the timing calibration apparatus comprising: an optical modulator provided in the probe for modulating quantity of light in correspondence to the amplitude value of a calibration pulse taken in the probe from the IC socket; and a photoelectric converter provided in the IC tester for converting the quantity of light of the modulated optical signal transmitted from the optical modulator into an electric signal and supplying the electric signal to comparating means to which a strobe pulse is to be applied.

In a third aspect of the present invention, there is provided a timing calibration apparatus in an IC tester, the IC tester comprising: an IC socket on which an IC under test is to be mounted; signal paths including drivers respectively, each applying a calibration pulse to the IC socket; a probe to be sequentially contacted with terminals of the IC socket to take therein a calibration pulse applied to the IC socket; signal paths including comparating means respectively, each being connected with corresponding one of the terminals of the IC socket and being supplied through the IC socket with a calibration pulse having the reference phase generated from the probe; and timing calibration means for conforming a signal propagation time on each of the driver included signal paths to the reference value as well as conforming the applied timing of each of strobe pulses given to the comparating means to the predetermined reference phase of the calibration pulse, the timing calibration apparatus comprising: an optically driven type driver provided in the probe; an optical drive signal supply means provided in the IC tester for supplying an optical drive signal to the optically driven type driver to generate the calibration pulse having the reference phase from the optically driven type driver; an optical modulator provided in the probe for modulating quantity of light in correspondence to the amplitude value of a calibration pulse taken in the probe from the IC socket; and a photoelectric converter provided in the IC tester for converting the quantity of light of the modulated optical signal transmitted from the optical modulator into an electric signal and supplying the electric signal to comparating means to which a strobe pulse is to be applied.

In a preferred embodiment, the aforesaid optically driven type driver comprises: a plurality of photoconductive elements, each coming to electrically conductive state by applying light thereon; and a plurality of voltage supplies selected by the plurality of the photoconductive elements respectively, and for generating voltages corresponding to a logical signal.

The aforesaid optical modulator has such a structure that an electric field formed by the voltage of the calibration pulse is applied to either one of branched two optical waveguides, the direction of the electric field being orthogonal to the travelling direction of light, and the optical modulator is one of the type which modulates light by utilizing a delay of light caused by application of the electric field to light and varying the quantity of light of an interference light obtained by that the branched two lights have been unified.

An optical cable couples between the optically driven type driver and the optical drive signal supply means and between the optical modulator and the photoelectric converter.

In a fourth aspect of the present invention, there is provided a timing calibration method in an IC tester, the IC tester comprising: an IC socket on which an IC under test is to be mounted; signal paths including drivers respectively, each applying a calibration pulse to the IC socket; a probe to be sequentially contacted with terminals of the IC socket to take therein a calibration pulse applied to the IC socket; signal paths including comparating means respectively, each being connected with corresponding one of the terminals of the IC socket and being supplied through the IC socket with a calibration pulse having the reference phase generated from the probe; and timing calibration means for conforming a signal propagation time on each of the driver included signal paths to the reference value as well as conforming the applied timing of each of strobe pulses given to the comparating means to the predetermined reference phase of the calibration pulse, the timing calibration method comprising the steps of: converting, in the IC tester, an electric signal outputted from a waveform formatter into an optical signal; supplying the optical signal to a photoconductive element of an optically driven type driver provided in the probe; and generating the calibration pulse having the reference phase from the optically driven type driver.

In a fifth aspect of the present invention, there is provided a timing calibration method in an IC tester, the IC tester comprising: an IC socket on which an IC under test is to be mounted; signal paths including drivers respectively, each applying a calibration pulse to the IC socket; a probe to be sequentially contacted with terminals of the IC socket to take therein a calibration pulse applied to the IC socket; signal paths including comparating means respectively, each being connected with corresponding one of the terminals of the IC socket and being supplied through the IC socket with a calibration pulse having the reference phase generated from the probe; and timing calibration means for conforming a signal propagation time on each of the driver included signal paths to the reference value as well as conforming the applied timing of each of strobe pulses given to the comparating means to the predetermined reference phase of the calibration pulse, the timing calibration method comprising the steps of: modulating, in the probe, quantity of light of a propagating light in correspondence to the amplitude value of a calibration pulse taken in the probe from the IC socket; and converting the quantity of light of the modulated optical signal transmitted to the IC tester from the probe into an electric signal; and supplying the electric signal to comparating means and conforming the timing of the calibration pulse to the timing of a strobe pulse which is to be applied to the comparating means.

According to the present invention, since the IC tester and the test head to which the probe is attached are coupled with each other by an optical cable and a calibration pulse is converted into an optical signal which is received and transmitted between the IC tester and the test head or the probe, the optical signal is hardly deteriorated in its waveform, even if the optical cable is somewhat longer.

Accordingly, the calibration of timing can be carried out with high accuracy.

Moreover, the timing of a calibration pulse taken in the probe and the timing of a calibration pulse supplied to the IC socket from the probe are measured by the timing measuring function that the IC tester is provided with. Accordingly, no high expensive instrument such as an oscilloscope is needed, and hence a cost required to carry out the calibration of timing can be reduced.

Furthermore, in accordance with the present invention, even in case of calibrating the applied timing of a strobe pulse which strobes a response signal inputted into comparating means of the IC tester, the applied timing of the strobe pulse is calibrated by generating a direct wave in the probe side. Therefore, the accuracy of the timing calibration can be improved.

In addition, in the probe provided on the test head side are housed only the optically driven type driver and the optical modulator, and no pyrogenic electric or electronic circuit elements or parts accompanied by heat are not used in the probe. Accordingly, a rise in temperature in the probe is very small, and temperature in the probe is stable. As a result, there occurs no problem that the propagation delay time of a signal varies due to a change of temperature. Thus, highly stable and reliable timing calibration apparatus and method can be provided.

BRIEF DESCRIPTION OF THE DRAWINGS

FIGS. 10A–10E are timing charts for explaining the operations of the timing generator and the waveform formatter shown in FIG. 9;

FIGS. 11A–11E are timing charts for explaining an example of the timing measuring function that the IC tester shown in FIG. 8 is provided with; and FIGS. 12A–12E are timing charts for explaining another example of the timing measuring function that the IC tester shown in FIG. 8 is provided with.

DETAILED DESCRIPTION OF THE PREFERRED EMBODIMENTS

The present invention utilizes the timing generating function and the timing measuring function that a conventional IC tester is originally provided with, and provides a timing calibration apparatus and a timing calibration method having high accuracy and capable of calibrating a timing on the IC tester as well as capable of reducing the cost required to carry out the timing calibration. Therefore, prior to describing preferred embodiments of the present invention, a general description of the timing generating function and the timing measuring function that a conventional IC tester is originally provided with will be provided for the purpose of easy understanding of the present invention.

Figure 8:
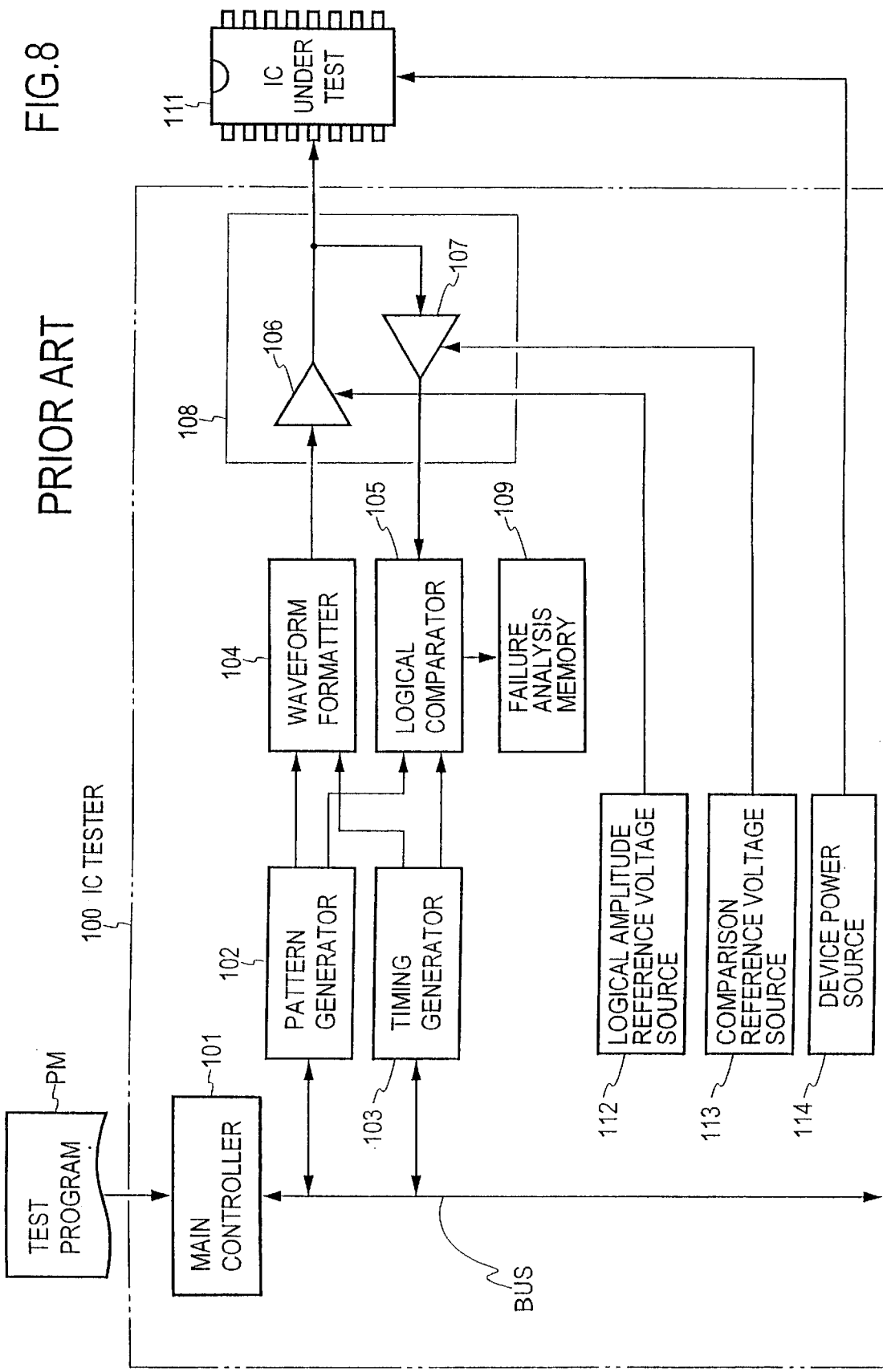
FIG. 8 is a block diagram showing, in outline, the construction of on example of the known IC testers.

FIG. 8 is a block diagram showing, in outline, the construction of one example of the generally known IC testers. The IC tester 100 comprises, roughly speaking, a main controller 101, a pattern generator 102, a timing generator 103, a waveform formatter 104, a logical comparator 105, a driver 106, an analog level comparator (hereinafter, referred to as comparator) 107, a failure analysis memory 109, a logical amplitude reference voltage source 112, a comparison reference voltage source 113, and a device power source 114.

The main controller 101 is generally constituted by a computer system, in which a test program PM created by a user (programmer) is stored in advance, and the entire IC tester (mainly, the pattern generator 102 and the timing generator 103) is controlled in accordance with the test program PM. The main controller 101 is connected, via a tester bus BUS, to the pattern generator 102, the timing generator 103, and the like. Although not shown, the failure analysis memory 109, the logical amplitude reference voltage source 112, the logical amplitude reference voltage source 112, the comparison reference voltage source 113, and the device power source 114 are also connected to the main controller 101.

First of all, before the testing of an IC is started, various kinds of data are set from the main controller 101. After the various kinds of data have been set, the testing of an IC is started. When the main controller 101 gives a test starting instruction or command to the pattern generator 102, the pattern generator 102 starts to generate a pattern. The pattern generator 102 supplies test pattern data to the waveform formatter 104 in accordance with the test program PM.

The timing generator 103 generates timing signals (clock pulses) for defining timings of rise and fall of the waveform of a test pattern signal applied to an IC to be tested (IC under test) 111 respectively, and also generates a timing signal (clock pulse) for a strobe pulse which defines a timing of a logical comparison between an expected value pattern signal supplied from the pattern generator 102 and a response signal outputted from the IC under test 111 in the logical comparator 105, and the like.

Timings and periods that those timing signals are to be generated are described in the test program PM created by a user, and it is arranged that a test pattern signal can be applied to the IC under test 111 with an operating period and at a timing designed or established by the user to actually operate the IC under test 111, and whether that operation of the IC under test is normal or not can be tested.

The waveform formatter 104 converts the test pattern data supplied from the pattern generator 102 into a test pattern signal having a real waveform. This test pattern signal is applied to the IC under test 111 via the driver 106 that amplifies the voltage of the test pattern signal to a waveform having an amplitude value set by the logical amplitude reference voltage source 112.

A response signal outputted or read out from the IC under test 111 is compared with a reference voltage supplied from the comparison reference voltage source 113 in the comparator 107, and it is determined whether or not the response signal has a predetermined logical level, i.e., whether or not the response signal has a predetermined logical H (logic high) voltage or logical L (logic low) voltage. A response signal determined to have the predetermined logical level is sent to the logical comparator 105, where the response signal is compared with an expected value pattern signal outputted from the pattern generator 102, and whether the IC under test 111 has outputted a normal response signal or not is determined.

In case that the IC under test 111 is a memory element, if the response signal does not coincide with the expected value pattern signal, the logical comparator 105 determines that the memory cell having an address of the IC under test 111 from which that response signal has been read out is defective (failure), and generates a failure signal indicating that fact. Usually, when the failure signal is generated, a writing of a failure data (generally logical "1" signal) applied to a data input terminal of the failure analysis memory 109 therein is enabled, and the failure data is stored in an address of the failure analysis memory 109 specified by an address signal being supplied to the failure analysis memory 109 at that time.

The failure analysis memory 109 has its operating rate or speed and its memory capacity equivalent to those of the IC under test 111, and the same address signal as the address signal applied to the IC under test 111 is also applied to this failure analysis memory 109. In addition, the failure analysis memory 109 is initialized prior to the start of a testing. For example, when initialized, the failure analysis memory 109 has data of logical "0s" written in all of the addresses thereof. Every time a failure signal representing the anti-coincidence is generated from the logical comparator 105 during a testing of the IC under test 111, a failure data of logical "1" indicating the failure of a memory cell is written in the same address of the failure analysis memory 109 as that of the memory cell of the IC under test 111 from which that anti-coincidence has occurred.

On the contrary, when the response signal coincides with the expected value pattern signal, the logical comparator 105 determines that the memory cell having an address of the IC under test 111 from which that response signal has been read out is not defective (pass), and generates a pass signal indicating that fact. Usually, this pass signal is not stored in the failure analysis memory 109.

After the testing has been completed, the failure data stored in the failure analysis memory 109 are read out therefrom into a failure relief analyzer not shown, and it is determined, for example, whether a relief or repair of failure memory cells of the tested IC is possible or not.

Further, in FIG. 8, only one waveform formatter 104, only one driver 106 and only one comparator 107 are shown. However, the waveform formatter 104 and the driver 106 are actually provided as many as numbers equal to the number of input terminals of the IC under test 111, for example, if the number of input terminals is 512, then the waveform formatter 104 and the driver 106 are provided as many as 512, respectively. Likewise, the comparator 107 is actually provided as many as numbers equal to the number of output terminals of the IC under test 111 (since the number of input terminals provided is usually equal to the number of output terminals provided, the number of comparators 17 provided is equal to the number of drivers 16 provided). And, test pattern signals are applied to predetermined numbers of input terminals of the IC under test 111 through the drivers, respectively, the number of which is equal to the number of the input terminals, and response signals outputted from the predetermined numbers of associated output terminals are supplied to the comparators, respectively, the number of which is equal to the number of the output terminals. Further, although there are cases that the input terminals of the IC under test 111 are provided as separate terminals from the output terminals of the IC under test 111, there are many cases in general that each terminal of the IC under test 111 is used in common as both the input terminal and the output terminal as shown in FIG. 8.

The IC under test 111 is mounted on an IC socket of a test head (not shown) constructed separately from the IC tester proper (main frame). Usually, the test head includes a member called "socket board" and a member called "mother board" on which the socket board is mounted, and a predetermined number of IC sockets are mounted on the socket board. In addition, a circuit including the driver 106 and the comparator 107 each being connected to each pin of the IC under test 111 is called "pin electronics" in this technical field.

Figure 9:
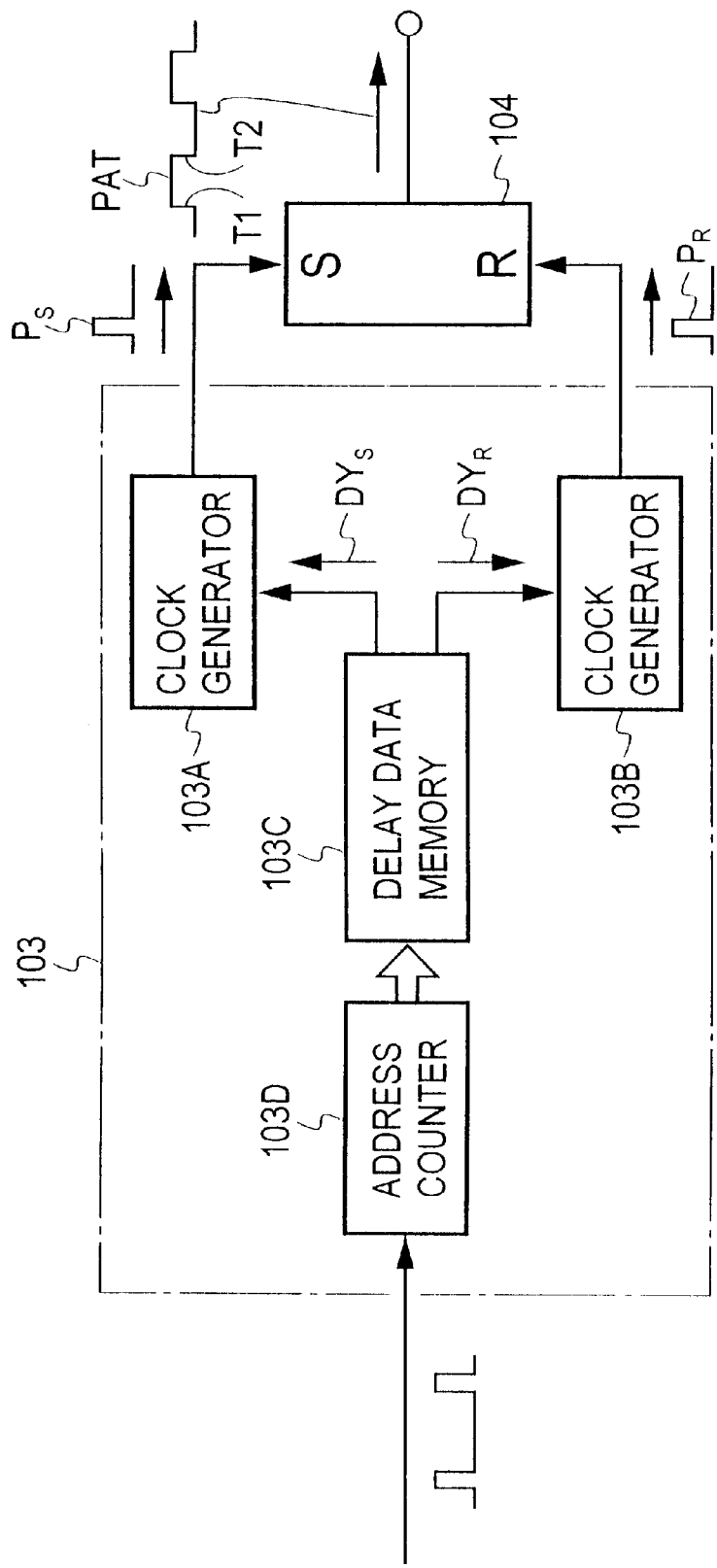
FIG. 9 is a block diagram for explaining the principle constructions and the operations of the timing generator and the waveform formatter used in the IC tester shown in FIG. 8.

A simplified construction of the waveform formatter 104 and the timing generator 103 for generating a test pattern signal for one channel is shown in FIG. 9. Because of the principle construction, the illustrated construction has been considerably simplified as compared with an actual IC tester in practical use, but it has the same function as that of the actual IC tester. The waveform formatter 104 can be composed of an S-R (set-reset) flip-flop, and when the timing generator 103 supplies a set pulse $P_S$ and a reset pulse $P_R$ at predetermined timings T1 and T2 respectively to the set terminal S and the reset terminal R of the S-R flip-flop, the S-R flip-flop generates a test pattern signal PAT that rises at the predetermined timing T1 and falls at the predetermined timing T2.

The timing generator 103 comprises an address counter 103D, a delay data memory 103C, and a pair of clock generators 103A and 103B. The set pulse $P_S$ and the reset pulse $P_R$ are generated from the pair of clock generators 103A and 103B, respectively.

The address counter 103D generates an address signal the address of which will be incremented by one (+1) for one test period $TS_{RAT}$ from the starting point of the test. The address signal is supplied to the delay data memory 103C. In the delay data memory 103C are stored delay data for set pulse and delay data for reset pulse preset for each test period $TS_{RAT}$, and delay data for set pulse and delay data for reset pulse in the delay data memory 103C accessed by an address signal supplied from the address counter 103D are supplied to the associated clock generators 103A and 103B, respectively. The pair of clock generators 103A and 103B are defined in their timings of generating a set pulse $P_S$ and a reset pulse $P_R$ by the delay data for set pulse $DY_S$ and the delay data for reset pulse $DY_R$, respectively, supplied from the delay data memory 103C.

In this manner, the address counter 103D allocates an address to each test period $TS_{RAT}$ in the test cycle and reads out from the delay data memory 103C delay data for set pulse and delay data for reset pulse preset for each test period $TS_{RAT}$. Since these delay data for set pulse $DY_S$ and delay data for reset pulse $DY_R$ are set in the clock generators 103A and 103B, respectively, the clock generators 103A and 103B generates a set pulse $P_S$ and a reset pulse $P_R$ at timings set by these delay data, respectively.

FIG. 10 shows a timing chart for explaining the operation mentioned above. FIG. 10A shows a rate clock RAT for defining each test period $TS_{RAT}$, and FIG. 10B shows a clock signal CK. In the first test period $TS_{RAT}$, preset delay data for set pulse $DY_{S1}$ and delay data for reset pulse $DY_{R1}$ are read out from the delay data memory 103C, and when these delay data $DY_{S1}$ and $DY_{R1}$ are set in the clock generators 103A and 103B respectively, the clock generator 103A generates a set pulse $P_S$ at the timing T1 delayed by the preset delay data $DY_{S1}$ from the rise timing of the rate clock RAT as shown in FIG. 10C, and the clock generator 103B generates a reset pulse $P_R$ at the timing T2 delayed by the preset delay data $DY_{R1}$ from the rise timing of the rate clock RAT as shown in FIG. 10D. Accordingly, as shown in FIG. 10E, from the waveform formatter 104 is generated a test pattern signal PAT having its pulse width corresponding to a time duration (T2−T1) $T_{PW}$ from the rise timing T1 of the set pulse $P_S$ to the rise timing T2 of the reset pulse $P_R$.

From the foregoing description, the timing generating function that a conventional IC tester is originally provided with will be understood, that is, it will be understood that a conventional IC tester has a function capable of setting a test pattern signal PAT such that it rises at arbitrary timing and falls at arbitrary timing in each test period $TS_{RAT}$.

Next, the timing measuring function that the IC tester shown in FIG. 8 is originally provided with will be explained with reference to FIGS. 11A–11E and 12A–12E. This timing measuring function is included mainly in a circuit portion including the comparator 107, and the following operations are performed in the comparator 107:

(A) An operation for fetching the logical value of a response signal outputted from the IC under test 111 therein to compare in level, and supplying the response signal having a predetermined level to the logical comparator 105; and (B) An operation for measuring the rise timing or fall timing of this response signal.

FIGS. 11A–10E are timing charts for explaining the above-mentioned operation (A). In case of the operation (A), a timing of a strobe pulse STB is set to a timing at which a response signal TX from the IC under test 111 shown in FIG. 11B is expected to arrive at the comparator 107, the strobe pulse STB generated at this set timing is applied to the comparator 107 thereby to strobe the logical value of the response signal TX, and the strobed logical value is supplied to the logical comparator 105. Specifically, the strobe pulse STB generated at this set timing strobes the response signal TX which has been compared in level by the comparator 107 and outputted therefrom, and the strobed logical value of the response signal TX is supplied to the logical comparator 105. In the example shown in FIGS. 11A–11E as is apparent from FIGS. 11B and 11C, since the strobe pulse STB is applied to a portion of the response signal TX having logical H, the logical value having logical H is given from the comparator 107 to the logical comparator 105. Therefore, if an expected value in this test period supplied to the logical comparator 105 is of logical H as shown in FIG. 11D, the result of logical decision in the logical comparator 105 becomes a pass (good), and hence the logical decision result of OK (good) is outputted from the logical comparator 105 as shown in FIG. 11E.

FIGS. 12A–12E are timing chart for explaining the above-mentioned operation (B). In case of measuring the rise timing or fall timing of the response signal TX shown in FIG. 12B, as shown in FIG. 12C, a plurality of strobe pulses STB-1, STB-2, STB-3, . . . are sequentially generated within one test period $TS_{RAT}$ to supply them to the comparator 107, thereby to sequentially strobe an output signal having a predetermined level outputted from the comparator 107, the phases of these strobe pulses being shifted by a predetermined value in sequence within the one test period ranging from the phase at the start time point of the test period to the phase at the end time point thereof. The rise timing or fall timing of the response signal TX is measured on the basis of the timing of generation of the strobe pulse that has strobed an output signal the logical value of which has been changed, among the strobed signals, the timing of generation of the strobe pulse STB-J in the example shown in FIG. 12C, and the phase at the start time point of the test period. This timing of generation of the strobe pulse STB-J is substantially equal to the timing when the logical decision output from the logical comparator 105 shown in FIG. 12E has inverted in its logical state. Further, though there is illustrated in FIGS. 12A–12E the operation for measuring the rise timing of the response signal TX, it is apparent that the fall timing of the response signal TX can be also measured on the basis of the timing of generation of the strobe pulse in like manner, and accordingly the explanation thereof will be omitted.

From the foregoing discussion, it will be understood that a conventional IC tester has a function capable of setting a timing of generation of a test pattern signal to an arbitrary timing and a function capable of measuring the rise timing and the fall timing of a response signal outputted from an IC under test.

The present invention relates to a timing calibration apparatus and method in an IC tester for calibrating a timing on the IC tester by utilizing the functions that the IC tester described above is provided with. Now, preferred embodiments of the present invention will be described in detail with reference to FIGS. 1 to 7. This invention may, however, be embodied in many different forms and should not be construed as limited to the embodiments set forth hereinafter; rather, these embodiments are provided so that this disclosure will be thorough and complete, and will fully convey the scope of the invention to those skilled in the art.

Figure 1:
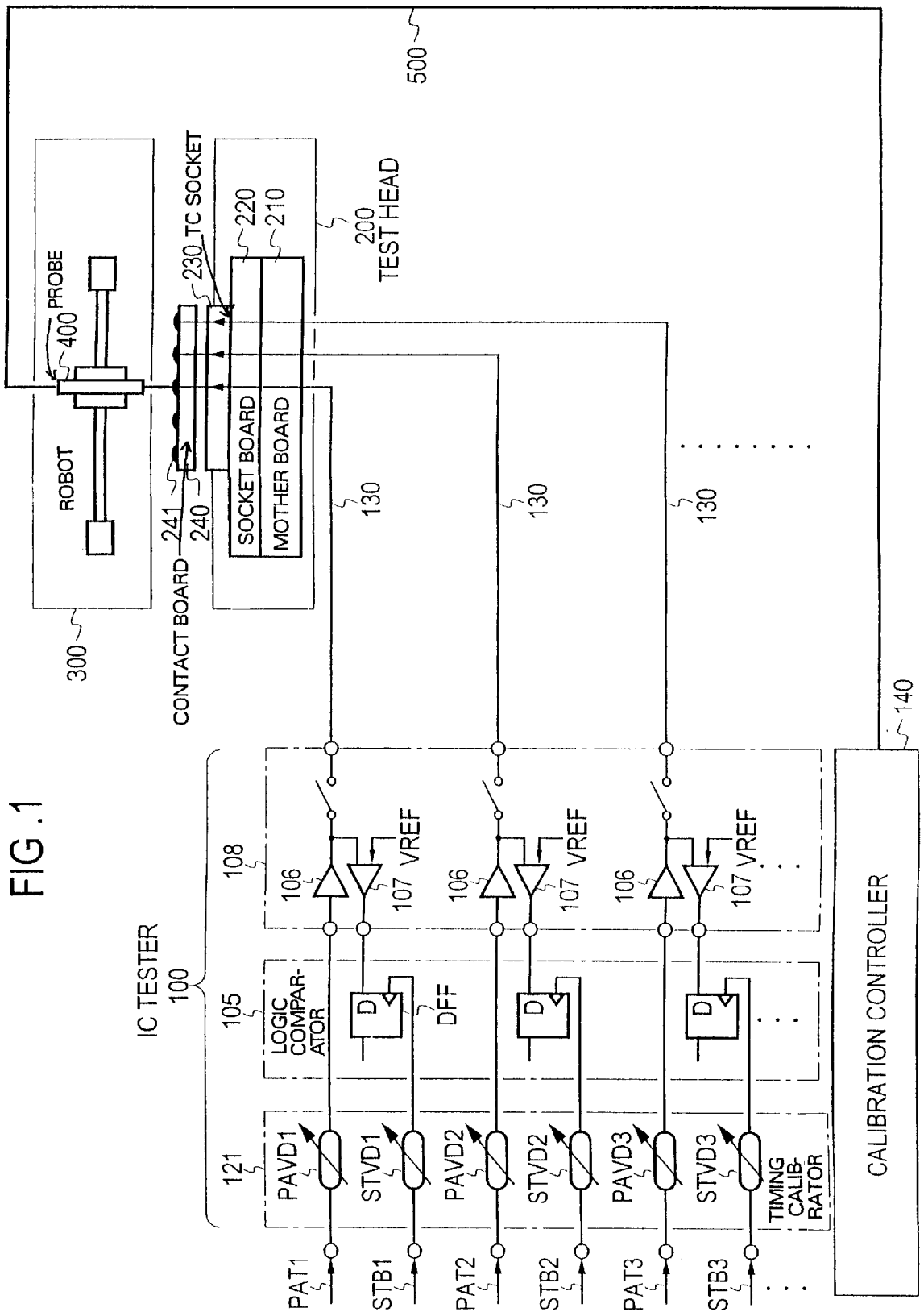
FIG. 1 is a block diagram showing, in outline, the construction of a first embodiment of the timing calibration apparatus according to the present invention.

FIG. 1 is a block diagram showing, in outline, the construction of a first embodiment of the timing calibration apparatus in an IC tester according to the present invention. Further, in FIG. 1, elements and portions corresponding to the elements and portions in the IC tester 100 already explained with reference to FIG. 8 will be shown by the same reference characters affixed thereto, and the explanations thereof will be omitted unless necessary.

In the first embodiment shown in FIG. 1, a timing calibrator 121 is inserted in signal paths at the output sides of a predetermined number of waveform formatters 104 (see FIG. 8) and in signal paths at the output side of the timing generator 103 (see FIG. 8) so that phases of test pattern signals PAT1, PAT2, PAT3, . . . supplied from these waveform formatters 104 to the corresponding drivers 106 of the pin electronics 108 respectively can be adjusted as well as phases of strobe pulses STB1, STB2, STB3, . . . supplied from the timing generator 103 to a predetermined number of comparators 107 of the pin electronics 108 can be adjusted. Further, in order to simplify the figure, in FIG. 1 two timing calibrators are combined into one and the combined calibrators are denoted by reference number 121.

The timing calibrator 121 inserted in the signal paths at the output sides of the waveform formatters 104 (accordingly, at the input sides of the respective drivers 106) comprises variable delay circuits PAVD1, PAVD2, PAVD3, . . . the number of which is equal to that of the drivers 106. These variable delay circuits PAVD1, PAVD2, PAVD3, . . . are capable of delaying the test pattern signals PAT1, PAT2, PAT3, . . . supplied from the predetermined number of the waveform formatters 104 to the corresponding drivers 106, respectively. The timing calibrator 121 inserted in the signal paths at the output side of the timing generator 103 comprises variable delay circuits STVD1, STVD2, STVD3, . . . the number of which is equal to that of the comparators 107. These variable delay circuits STVD1, STVD2, STVD3, . . . are capable of delaying the strobe pulses STB1, STB2, STB3, . . . supplied from the timing generator 103 to the predetermined number of the comparators 107 in order to strobe response signals of the IC under test 111 (see FIG. 8) that are outputted from the respective comparators 107.

The variable delay circuits PAVD1, PAVD2, PAVD3, . . . the number of which is equal to that of the drivers 106 can adjust respective propagation delay times of the driver included signal paths for applying the test pattern signals PAT1, PAT2, PAT3, . . . to the IC under test 111 such that the test pattern signals PAT1, PAT2, PAT3, . . . will be applied almost concurrently to the IC under test 111, as discussed later, by setting delay times of the variable delay circuits PAVD1, PAVD2, PAVD3, . . . to appropriate values, respectively. Also, the variable delay circuits STVD1, STVD2, STVD3, . . . the number of which is equal to that of the comparators 107 can adjust respective propagation delay times of the comparator included signal paths through which response signals from the IC under test 111 will propagate such that the response signals will output almost concurrently from the comparators 107, as discussed later, by setting delay times of the variable delay circuits STVD1, STVD2, STVD3, . . . to appropriate values, respectively.

In this embodiment, at the input sides of the predetermined number of the logical comparators 105 (accordingly, at the output sides of the comparators 107) are inserted respectively D-type flip-flops DFF. The response signals outputted from the respective comparators 107 are taken in the D-type flip-flops DFF, and the strobe pulses STB1, STB2, STB3, . . . are applied from the timing generator 103 through the variable delay circuits STVD1, STVD2, STVD3, . . . to the clock terminals of the corresponding D-type flip-flops DFF, thereby to conform respective applied timings of the response signals fetched into the corresponding logical comparators 105 (respective timings of the strobed response signals to be applied to the corresponding logical comparators 105) with one another. Thus, the timing calibration is carried out. It is needless to say that the present invention is limited to the circuit arrangement shown. For example, it may be constructed that the strobe pulses STB1, STB2, STB3, . . . are applied from the timing generator 103 through the variable delay circuits STVD1, STVD2, STVD3, . . . to the corresponding comparators 107 respectively, thereby to conform respective applied timings of the response signals taken in the corresponding logical comparators 105 with one another. Further, in order to simplify the figure, in FIG. 1 the predetermined number of the logical comparators 105 are not shown by respective blocks but are denoted by a reference number 105. In this technical field, a signal path on which a test pattern signal is transmitted or a signal path on which a response signal from an IC under test is transmitted is called a channel. Accordingly, the IC tester 100 is provided with a plurality of channels the number of which corresponds to that of the input/output terminals of the IC under test.

The test pattern signals PAT1, PAT2, PAT3, . . . supplied from the waveform formatters 104 to the corresponding drivers 106, one being provided for one channel, are sent to the test head 200 through respective cables 130.

FIG. 1 shows a state that the IC under test is put-in the timing calibration mode. In the timing calibration mode, on an IC socket 230 attached to the test head 200 is mounted a member 240 (hereinafter, referred to as contact board) called a contact board instead of an IC under test. The contact board has electric pads 241 formed on the surface with which a probe 400 contacts, the probe 400 being one of members constituting the timing calibration apparatus. A calibration pulse is supplied to the probe 400 through the associated driver 106, and the respective delay times of the variable delay circuits PAVD1, PAVD2, PAVD3, . . . inserted at the intput sides of the respective drivers 106 are set such that all timings at which the calibration pulse will arrive at the probe 400 on all of the channels are the same with one another.

Explaining in detail, the contact board 240 has a plurality of electric conductors the number of which is equal to that of the pins of the IC socket 230, the conductors passing through the contact board 240 from the surface thereof to the back surface thereof and being electrically insulated with one another. Each conductor is connected to corresponding one of the pads 241 formed on the surface of the contact board 240. Accordingly, by mounting the contact board 240 on the IC socket 230, the electric pads 241 formed on the surface of the contact board 240 are electrically connected with the corresponding contacts (pins) of the IC socket 230 through the conductors, respectively. The probe 400 is automatically conveyed by a robot (a device or mechanism having three movable axes on X, Y and Z and an automatically positioning function) 300 such that the probe 400 contacts with the electric pads 241 of the contact board 240 in sequence. Thus, the timing calibration for each channel is automatically carried out.

In the IC tester 100 constructed mentioned above, in case of adjusting respective propagation delay times of the comparator included signal paths in order to calibrate timings at which the response signals of the IC under test outputted from the comparators 107 are taken in the corresponding logical comparators 105, a calibration pulse is generated in the probe 400. This calibration pulse is inputted to one of the comparators 107 in respective channels from the contact board 240 through the IC socket 230, the socket board 220, the mother board 210 and the cable 130 in the written order. In this embodiment, the calibration pulse outputted from the comparator 107 is supplied to the D-type flip-flop DFF provided at the output side of the comparator 107, and the delay values (times) of the variable delay circuits STVD1, STVD2, STVD3, . . . of the timing calibrator 121 are adjusted such that calibration pulses will be outputted from all of the D-type flip-flops DFF at the same timing. Since these delay values set the applying timings of the strobe pulses STB1, STB2, STB3, . . . at which they are to be applied from the timing generator 103 to the corresponding D-type flip-flops DFF, the signal propagation delay times on the signal paths from the IC socket 230 to the comparators 107 (the comparator included signal paths) in respective channels can be measured from the delay values set in the variable delay circuits STVD1, STVD2, STVD3, . . . respectively.

The features of the first embodiment reside in:
that (1)a calibration controller 140 described later is provided in the IC tester 100, the calibration controller 140 and the probe 400 are interconnected by a optical cable 500, an electrical calibration pulse taken in the probe 400 is converted into an optical signal which is in turn transmitted to the calibration controller 140 through the optical cable 500, and in the calibration controller 140 the received optical signal is converted into an electrical signal to measure the propagation delay times on the driver included signal paths in the IC tester 100; and that (2) an optical calibration pulse is outputted from the calibration controller 140, this optical calibration pulse is inputted into the probe 400 through the optical cable 500, the optical calibration pulse is converted into an electrical signal by an optically driven type driver described later which is provided in the probe 400, thereby to generate a calibration pulse, and this calibration pulse is inputted into each of the comparators 107 in respective channels from the contact board 240 through the IC socket 230, the socket board 220, the mother board 210 and the cable 130 in the written order, thereby to measure the propagation delay times on the comparator included signal paths.

Figure 2:
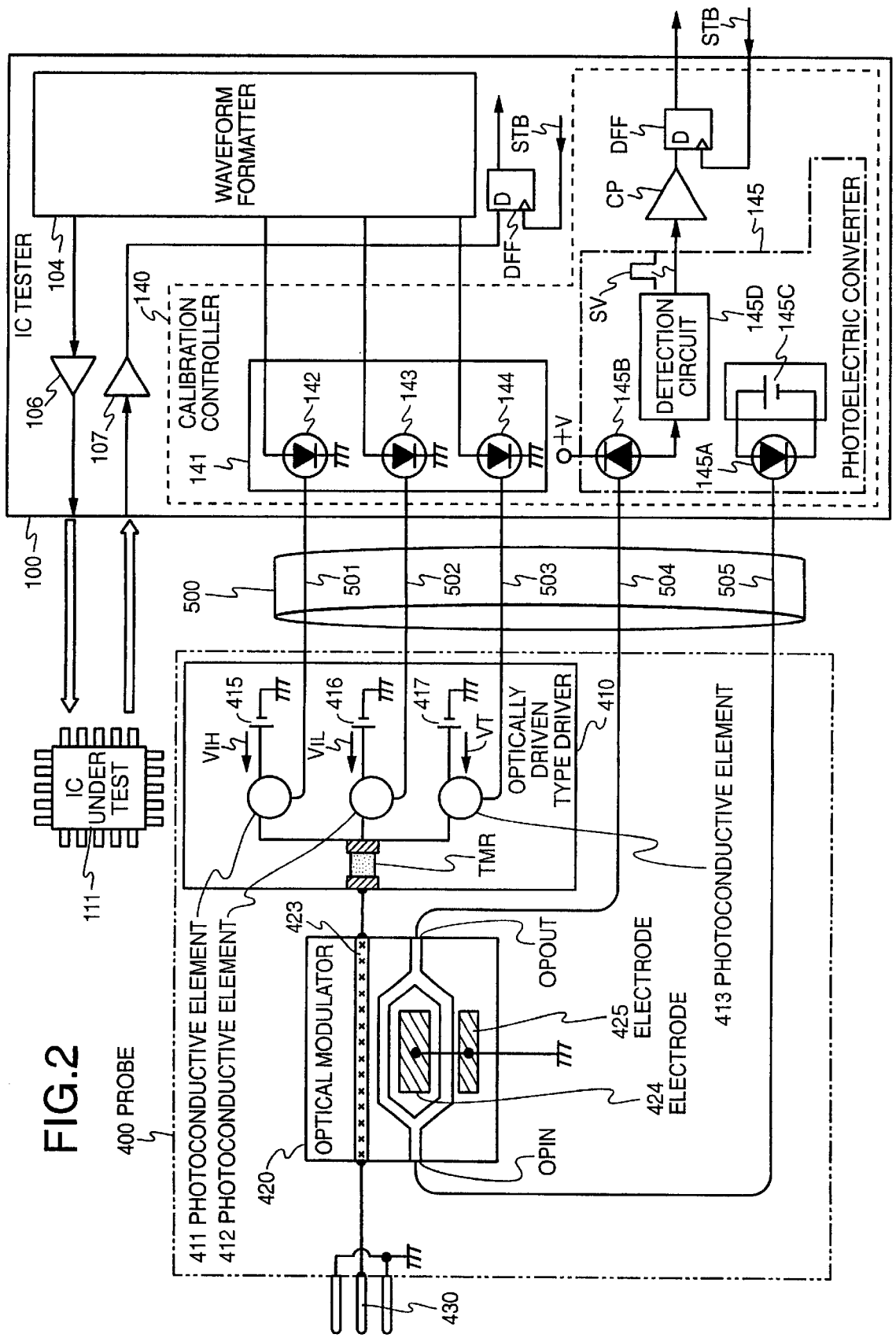
FIG. 2 is a block diagram showing a specific example of the calibration controller and the probe shown in FIG. 1.

FIG. 2 shows a concrete example of the construction of the probe 400 shown in FIG. 1 and a concrete example of the construction of the calibration controller 140 provided in the IC tester 100 proper.

The calibration controller 140 comprises an optical signal converter 141 which is driven by a drive signal given from the waveform formatter 104, and a photoelectric converter 145 for converting an optical signal given from the probe 400 into an electrical signal. The probe 400 comprises an optically driven type driver 410 which generates an electrical calibration pulse, and an optical modulator 420.

The optical signal converter 141 of the calibration controller 140 comprises, in this example, three laser diodes 142, 143 and 144. Among a plurality of optical fibers constituting the optical cable 500, optical fibers 501, 502 and 503 are optically coupled in their one ends to the laser diodes 142, 143 and 144, respectively. The other ends of the optical fibers 501, 502 and 503 are optically coupled to photosensitive portions of corresponding photoconductive elements 411, 412 and 413 of the optically driven type driver 410 provided in the probe 400, respectively.

Figure 3:
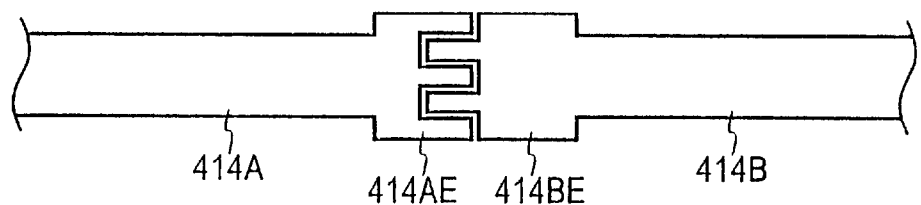
FIG. 3 is a plan view showing an example of the structure of the photoconductive element shown in FIG. 2.

The optically driven type driver 410 of the probe 400 includes direct current voltage sources 415, 416 and 417 for generating a calibration pulse, and a terminal resistance TMR for impedance matching, in addition to the photoconductive elements 411, 412 and 413. The photoconductive elements 411, 412 and 413 may be configured, for example as shown in FIG. 3, by forming two microstrip lines 414A and 414B spaced a predetermined distance apart in a line on a substrate (not shown) made of GaAs and forming electrodes 414AE and 414BE each having a pectinated portion at opposed ends of the microstrip lines 414A and 414B, the pectinated portions of the electrodes 414AE and 414BE being loosely fitted so that they are electrically insulated. The photoconductive elements 411, 412 and 413 configured above take conductive state by irradiating the pectinated portions of the electrodes 414AE and 414BE from the optical fibers 501, 502 and 503, respectively, so that the two microstrip lines 414A and 414B are electrically connected with each other. More particularly, when the pectinated portions of the electrodes 414AE and 414BE are irradiated with light from each of the optical fibers 501, 502 and 503, a portion of the GaAs substrate between the pectinated portions comes to conductive during a time duration the pectinated portions are being irradiated with light. As a result, the two microstrip lines 414A and 414B being insulated with each other are now electrically connected with each other and become electrically conductive state.

The direct current voltage sources 415, 416 and 417 for generating a calibration pulse are connected to one ends of the photoconductive elements 411, 412 and 413, respectively. The direct current voltage source 415 generates, for example, a voltage $V_{IH}$ corresponding to the logical H of a calibration pulse, the direct current voltage source 416 generates, for example, a voltage $V_{IL}$ corresponding to the logical L of the calibration pulse. In addition, the direct current voltage source 417 generates, for example, a voltage VT to be applied to one end of the terminal resistance TMR in case of receiving the calibration pulse transmitted from the IC tester 100 through the driver 106.

Figure 4:
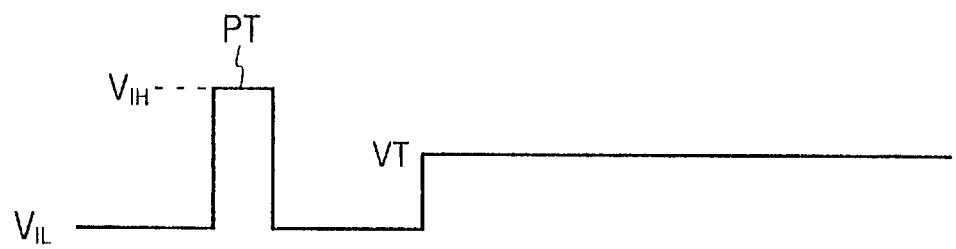
FIG. 4 shows a waveform illustrating an output waveform from the optically driven type driver shown in FIG. 2.

According to the optically driven type driver 410 arranged above, it will be easily understood that as shown in FIG. 4, the driver 410 can generate a calibration pulse PT having the voltage $V_{IL}$ as the logical L (low logic) and the voltage VIH as the logical H (high logic), and that in the mode wherein an electrical calibration signal is taken in the probe 400, the driver 410 can control such that the terminal voltage VT is being applied to the terminal resistance TMR. Accordingly, in case that the calibration pulse PT has been generated from the optically driven type driver 410, this calibration pulse PT can be sent, in the example shown in FIG. 2, to a microstrip 423 which is one of elements constituting the optical modulator 420 through the terminal resistance TMR. The calibration pulse PT will propagate through the microstrip 423 to a contact 430 provided on the probe 400, and be outputted through the contact 430 to the electric pad 241 of the contact board 240 shown in FIG. 1.

Next, the details of the optical modulator 420 provided in the probe 400 will be described with reference to FIGS. 5 and 6A–6B.

Figure 5:
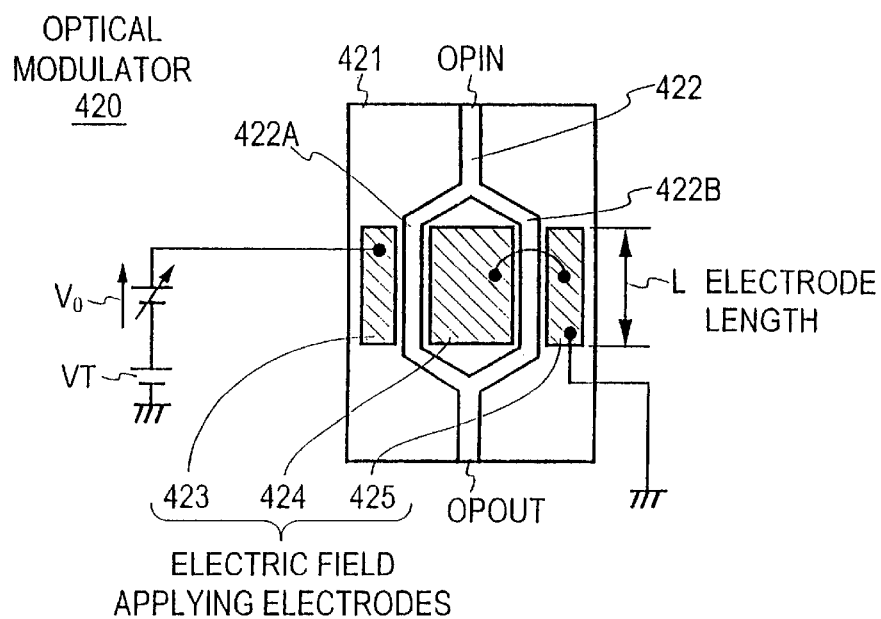
FIG. 5 is a plan view showing a specific example of the optical modulator shown in FIG. 2.
Figure 6:
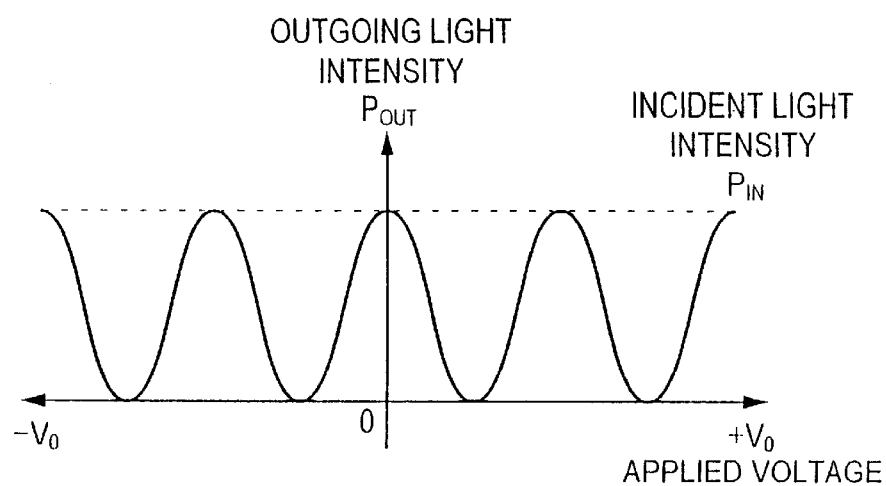
FIGS. 6A–6B shows waveforms for explaining the operation of the optical modulator shown in FIG. 5.
Figure 6:
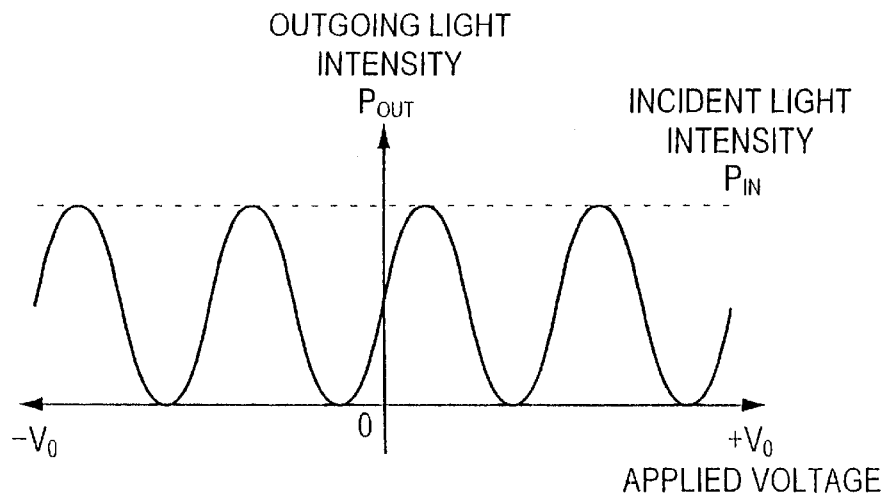

As the optical modulator 420, an interferometric optical modulator shown in FIG. 5 may be used, for example. The interferometric optical modulator 420 shown in FIG. 5 comprises an optical branching part for branching an optical waveguide or light guide 422 formed on a dielectric substrate 421 into two optical waveguides 422A and 422B, an optical coupling part for optically coupling the branched two optical waveguides 422A and 422B, and electric field applying electrodes 423, 424 and 425 formed along both sides of each of the two optical waveguides 422A and 422B between the optical branching part and the optical coupling part. Further, in the example shown in FIG. 5, the electric field applying electrode 424 sandwiched between the two optical waveguides 422A and 422B constitutes a common electrode to the two optical waveguides 422A and 422B.

The optical branching part, the optical coupling part and the optical waveguides 422, 422A and 422B can be formed by diffusing, for example, titanium or the like into the dielectric substrate 421 made of, for instance, lithium niobate ($LiNbO_3$) or the like, respectively. Optical waveguides such as optical fibers are optically coupled to a light receiving end OPIN and a light emitting end OPOUT formed and exposed on the end surfaces of the dielectric substrate 421, respectively. In the example shown in FIG. 2, one end of an optical fiber 505 of the optical cable 500 is optically coupled to the light receiving end OPIN, and one end of an optical fiber 504 of the optical cable 500 is optically coupled to the light emitting end OPOUT. The other end of the optical fiber 505 coupled to the light receiving end OPIN is optically coupled to a light source 145A such as a laser diode which is one component of the photoelectric converter 145 of the calibration controller 140, and the other end of the optical fiber 504 coupled to the light emitting end OPOUT is optically coupled to a photodetector 145B such as a photodiode which is also one component of the photoelectric converter 145.

The light source 145A is driven to its lighting state by a light source driving circuit 145C. This example shows that as the light source driving circuit 145C, a DC power supply is used and the light source 145A of laser diode is driven by the DC power supply. Accordingly, the light source 145A emits a fixed quantity of laser light into the optical fiber 505. On the other hand, to the photodetector 145B is connected a detection circuit 145D which converts the intensity of light emitted from the optical fiber 504 into a voltage signal SV to be taken out.

Between one pair 423 and 424 of the electric field applying electrodes 423, 424 and 425 of the optical modulator 420 is applied the sum of a variable voltage $V_0$ for forming an electric field and the terminal voltage VT generated across the terminal resistance TMR added to the variable voltage $V_0$ as a bias voltage (voltage $V_0$+voltage VT). In the example shown in FIG. 5, the sum of the variable voltage $V_0$ for forming an electric field and the terminal voltage VT generated across the terminal resistance TMR is applied to the outside electrode 423 of the one pair of the electric field applying electrodes 423 and 424, and the common electrode 424 is connected to a reference potential (ground potential in this example), thereby generating an electric field between the electrodes 423 and 424. The other pair of the electric field applying electrodes 424 and 425 are connected in common with each other as shown, and hence any electric field is not formed between the electrodes 423 and 424. Accordingly, no electric field is applied to the optical waveguide 422B formed between the other pair of the electric field applying electrodes 424 and 425.

By applying an electric field to the one optical waveguide 422A of the branched two optical waveguides and not applying any electric field to the other optical waveguide 422B as mentioned above, light passing through the one optical waveguide 422A applied with the electric field is phase modulated therein and light passing through the other optical waveguide 422B not applied with any electric field is not phase modulated. As a result, due to the phase modulation of light given in the one optical waveguide 422B, interference of light occurs in the optical coupling part, and the intensity of light (outgoing light) emitted to the optical fiber 504 varies accordingly.

The operation of the optical modulator 420 thus constructed will be described with reference to FIGS. 6A–6B. Let the intensity of light incident to the optical fiber 505 (the incident light intensity) and the intensity of light outputted to the optical fiber 504 (the outgoing light intensity) be represented by $P_{in}$ and $P_{out}$, respectively. When the voltage $V_0$ applies between the one pair of the electric field applying electrodes 423 and 424 and changes (the biasing voltage VT is not applied), the intensity $P_{out}$ of light outputted to the optical fiber 504 varies along the cosine curve as depicted in FIG. 6A. That is, when the applied voltage $V_0$ is 0V ($V_0$=0) (where VT=0), the outgoing light intensity $P_{out}$ equals to the incident light intensity $P_{in}$ ($P_{out}=P_{in}$), and when the voltage $V_0$ changes gradually in the positive (+) or negative (−) direction, the outgoing quantity of light gradually decreases along the cosine curve and goes down to zero at a certain voltage. When the applied voltage $V_0$ is further increased (at the absolute value) therefrom, the outgoing light intensity $P_{out}$ gradually increases along the cosine curve and when it is increased to a certain voltage, the outgoing light intensity $P_{out}$ goes to "1", namely, again the outgoing light intensity $P_{out}$ equals to the incident light intensity $P_{in}$ ($P_{out}=P_{in}$). With the subsequent change in the applied voltage $V_0$, the outgoing light intensity $P_{out}$ shows a modulation characteristic that it goes up and down between 1 and 0 along the cosine curve as shown in FIG. 6A.

The optical modulation characteristic shown in FIG. 6A is one obtained from the case that respective optical path lengths L of the two optical waveguides 422A and 422B have the same with each other. On the other hand, if the optical path length of one of the two optical waveguides has longer than that of the other of the two optical waveguides by a quarter of the wavelength of light propagating through the optical waveguides, or if the sum of the variable voltage $V_0$ for forming an electric field and the terminal voltage VT generated across the terminal resistance TMR added to the variable voltage $V_0$ as a bias voltage (voltage $V_0$+voltage VT) is applied between the two optical waveguides, an optical modulation characteristic can be obtained that the outgoing light intensity $P_{out}$ varies along the sine curve with a change in the applied voltage $V_0$, as shown in FIG. 6B. In such manner, when the optical modulation characteristic is changed to one that the outgoing light intensity $P_{out}$ varies along the sine curve as shown in FIG. 6B, the optical modulation characteristic that the outgoing light intensity sharply varies with the applied voltage $V_0$=0 as a center of the variation. Therefore, the following description will be given on the assumption that the optical modulator 420 has the branched two optical waveguides 422A and 422B the optical path length of one of which is longer than that of the other by a quarter of the wavelength of light passing through the optical waveguides and hence the initial position of the optical modulation characteristic is set to the state shown in FIG. 6B.

As is evident from the optical modulation characteristics of the optical modulator 420 described above, the optical modulator 420 modulates light for an inputted electric field to a certain extent (an inputted electric field that amount of phase modulation of light given thereby is within 360°) into a light signal that the outgoing light intensity $P_{out}$ thereof is expressed by a value between the state of $P_{out}=P_{in}$ and the state of $P_{out}$=0, that is, a value between $P_{out}/P_{in}$1 and $P_{out}/P_{in}$=0. Therefore, the detection circuit 145D shown in FIG. 2 outputs a pulse SV having its waveform equivalent to that of the calibration pulse given to the contact 430 from the IC socket 230. This pulse SV is compared in a comparator CP with the voltage having the logical L or logical H, and if its voltage has the logical L or logical H proper, the pulse SV is taken in the logical comparator 105 (see FIG. 8) at the timing at which the strobe pulse STB defined as the reference timing is supplied to the clock terminal of the D type flip-flop DFF.

From the foregoing discussion, it will be understood that the electrical calibration pulse PT can be outputted from the probe 400 toward the IC socket 230, and that the electrical calibration pulse applied to the IC socket 230 from the IC tester 100 can be fetched in the probe 400 through the contact 430, the fetched calibration pulse can be converted into an optical signal which is in turn transmitted to the calibration controller 140 provided in the IC tester 100, and in the calibration controller 140 the received optical signal can again be converted into an electrical signal, thereby to compare the arriving timing thereof with the reference timing in the circuit part including the comparator CP.

Accordingly, by previously calibrating the take-in timing of the electrical signal inputted into the comparator CP provided in the calibration controller 140 so that it defines the reference timing, and by setting the delay values of the variable delay circuits PAVD1, PAVD2, PAVD3, . . . of the timing calibrator 121 inserted into the driver included signal paths respectively such that the timing at which a calibration pulse outputted from each of the drivers 106 in respective channels arrives at the comparator CP of the calibration controller 140 coincides with the reference timing, the timing of each of the driver included signal paths can be calibrated.

In addition, by generating a calibration pulse having the reference phase (generating a calibration pulse at the reference timing) from the probe 400, inputting the calibration pulse into each of the comparators 107 in respective channels, and setting the delay times of the variable delay circuits STVD1, STVD2, STVD3, . . . of the timing calibrator 121 such that the applying timings of the strobe pulses STB1, STB2, STB3, . . . to be applied to the associated comparators 107 (in the embodiment shown in FIG. 1, the D-type flip-flops DFF provided at the respective output sides of the comparators 107) coincide with the reference phase of the calibration pulse, the timing of each of the comparator included signal paths can be calibrated.

Figure 7:
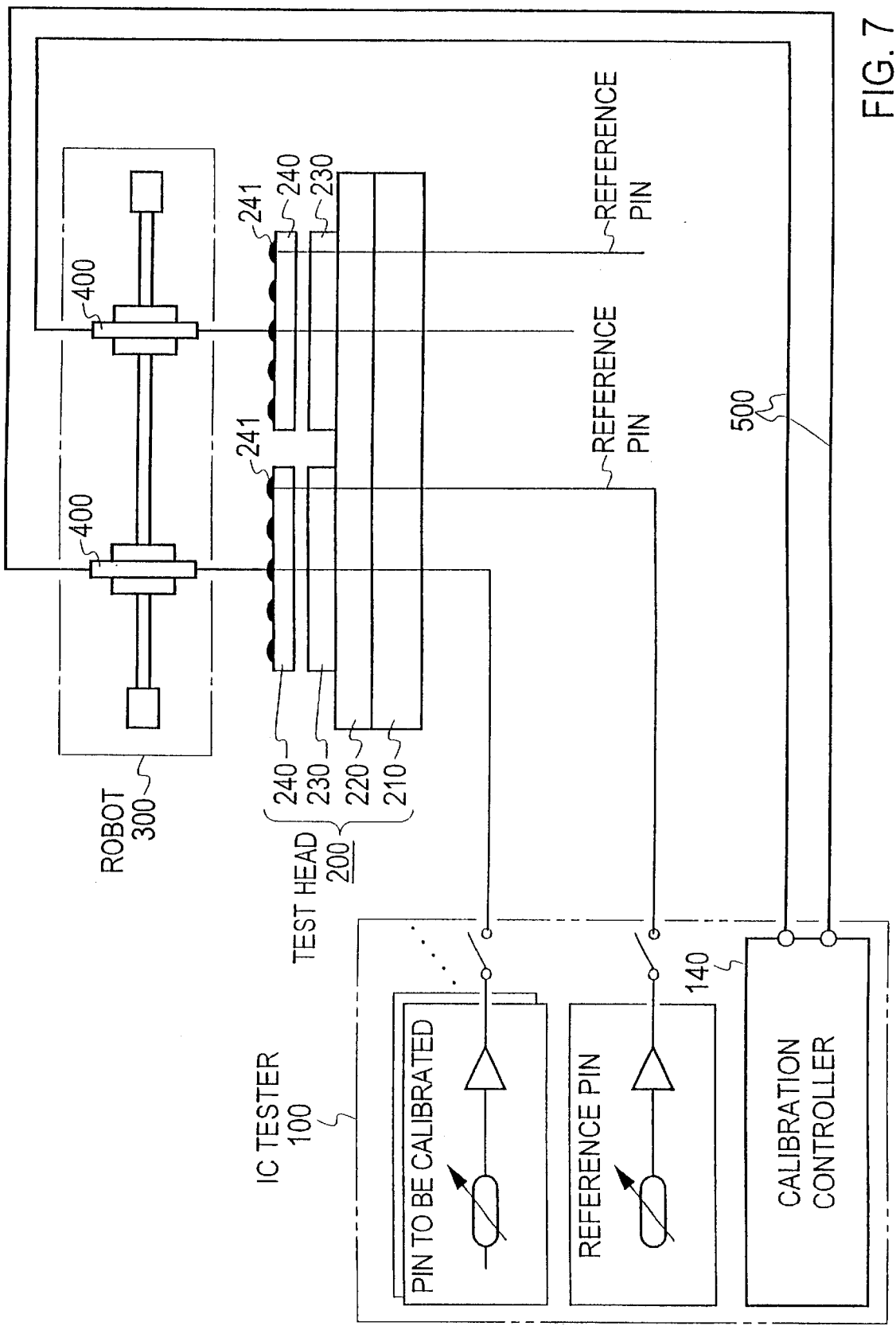
FIG. 7 is a block diagram showing, in outline, the construction of a second embodiment of the timing calibration apparatus according to the present invention.

FIG. 7 is a block diagram showing, in outline, the construction of a second embodiment of the timing calibration apparatus according to the present invention. Further, in FIG. 7, elements and portions corresponding to the elements and portions in FIG. 1 will be shown by the same reference characters affixed thereto, and the explanations thereof will be omitted unless necessary.

In this second embodiment, for each of IC sockets 230 mounted on the socket board 220 of the test head 200, the timing on one of the pins (terminals) of each IC socket 230 is calibrated to coincide with the reference timing, and this timing calibrated pin is defined as the reference pin. Then, by using the reference pin, the timing on the probe 400 and the timing on the calibration controller 140 are first calibrated. Secondly, by using these timing calibrated probe 400 and calibration controller 140, the timing on each of the remaining pins of each IC socket 230 is calibrated to coincide with the timing on the reference pin. Further, in FIG. 7, there is illustrated a case constructed such that a plurality of the probes 400 are attached to the same one robot 300, and the timing calibrations for the plurality of the IC sockets 230 are concurrently carried out. It goes without saying that the present invention is not limited to such construction.

In each of the embodiments described above, there is illustrated the IC tester in which the pin electronics 108 and the test head 200 are connected with each other via the cables 130. There are many IC testers in which their pin electronics 108 have been housed in the test heads 200, respectively. In each of the IC testers thus constructed, the output side of the timing calibrator 121 and the input sides of the logical comparators 105 will be connected with the pin electronics 108 housed in the test head 200 via the cables 130. It is needless to say that the present invention is also applied to such IC testers and the same functional effects can be obtained.

As is clear from the foregoing description, according to the present invention, the IC tester is constructed such that the probe and the IC tester are connected with each other via the optical cable, and a calibration pulse is converted into an optical signal which is received or transmitted between them. Accordingly, the calibration pulse is hardly deteriorated, which results in an improvement in the calibration accuracy. In addition, since no pyrogenic electric or electronic elements or parts accompanied by heat are mounted in the probe, a change of temperature in the probe can be suppressed. As a result, there occurs no problem that the propagation delay time of a signal varies due to a change of temperature, and hence highly stable and reliable timing calibration apparatus and method can be provided. Moreover, there is obtained an advantage that the probe can be miniaturized.

While the present invention has been described with regard to the preferred embodiments shown by way of example, it will be apparent to those skilled in the art that various modifications, alterations, changes, and/or minor improvements of the embodiments described above can be made without departing from the spirit and the scope of the present invention. Accordingly, it should be understood that the present invention is not limited to the illustrated embodiments, and is intended to encompass all such modifications, alterations, changes, and/or minor improvements falling within the scope of the invention defined by the appended claims.

What is claimed is:

1. A timing calibration apparatus in an IC tester, said IC tester comprising:

an IC socket on which an IC under test is to be mounted;

signal paths including drivers respectively, each applying a calibration pulse to said IC socket;

a probe to be sequentially contacted with terminals of said IC socket to take therein a calibration pulse applied to the IC socket;

signal paths including comparating means respectively, each being connected with corresponding one of the terminals of the IC socket and being supplied through the IC socket with a calibration pulse having the reference phase generated from said probe; and timing calibration means for conforming a signal propagation time on each of said driver included signal paths to the reference value as well as conforming the applied timing of each of strobe pulses given to the comparating means to the predetermined reference phase of the calibration pulse, said timing calibration apparatus comprising:

an optically driven type driver provided in said probe; and an optical drive signal supply means provided in said IC tester for supplying an optical drive signal to said optically driven type driver to generate the calibration pulse having the reference phase from the optically driven type driver.

2. A timing calibration apparatus in an IC tester, said IC tester comprising:

an IC socket on which an IC under test is to be mounted;

signal paths including drivers respectively, each applying a calibration pulse to said IC socket;

a probe to be sequentially contacted with terminals of said IC socket to take therein a calibration pulse applied to the IC socket;

signal paths including comparating means respectively, each being connected with corresponding one of the terminals of the IC socket and being supplied through the IC socket with a calibration pulse having the reference phase generated from said probe; and timing calibration means for conforming a signal propagation time on each of said driver included signal paths to the reference value as well as conforming the applied timing of each of strobe pulses given to the comparating means to the predetermined reference phase of the calibration pulse, said timing calibration apparatus comprising:

an optical modulator provided in said probe for modulating quantity of light in correspondence to the amplitude value of a calibration pulse taken in said probe from said IC socket; and a photoelectric converter provided in said IC tester for converting the quantity of light of the modulated optical signal transmitted from said optical modulator into an electric signal and supplying the electric signal to comparating means to which a strobe pulse is to be applied.

3. A timing calibration apparatus in an IC tester, said IC tester comprising:

an IC socket on which an IC under test is to be mounted;

signal paths including drivers respectively, each applying a calibration pulse to said IC socket;

a probe to be sequentially contacted with terminals of said IC socket to take therein a calibration pulse applied to the IC socket;

signal paths including comparating means respectively, each being connected with corresponding one of the terminals of the IC socket and being supplied through the IC socket with a calibration pulse having the reference phase generated from said probe; and timing calibration means for conforming a signal propagation time on each of said driver included signal paths to the reference value as well as conforming the applied timing of each of strobe pulses given to the comparating means to the predetermined reference phase of the calibration pulse, said timing calibration apparatus comprising:

an optically driven type driver provided in said probe;

an optical drive signal supply means provided in said IC tester for supplying an optical drive signal to said optically driven type driver to generate the calibration pulse having the reference phase from the optically driven type driver;

an optical modulator provided in said probe for modulating quantity of light in correspondence to the amplitude value of a calibration pulse taken in said probe from said IC socket; and a photoelectric converter provided in said IC tester for converting the quantity of light of the modulated optical signal transmitted from said optical modulator into an electric signal and supplying the electric signal to comparating means to which a strobe pulse is to be applied.

4. The timing calibration apparatus as set forth in claim 1 or 3, wherein said optically driven type driver comprises: a plurality of photoconductive elements, each coming to electrically conductive state by applying light thereon; and a plurality of voltage supplies selected by said plurality of the photoconductive elements respectively, and for generating voltages corresponding to a logical signal.

5. The timing calibration apparatus as set forth in claim 2 or 3, wherein said optical modulator has such a structure that an electric field formed by the voltage of the calibration pulse is applied to either one of branched two optical waveguides, the direction of said electric field being orthogonal to the travelling direction of light, and said optical modulator is one of the type which modulates light by utilizing a delay of light caused by application of the electric field to light and varying the quantity of light of an interference light obtained by that the branched two lights have been unified.

6. The timing calibration apparatus as set forth in claim 1 or 3, wherein said optically driven type driver is coupled to said optical drive signal supply means by an optical cable.

7. The timing calibration apparatus as set forth in claim 2 or 3, wherein said optical modulator is coupled to said photoelectric converter by an optical cable.

8. A timing calibration method in an IC tester, said IC tester comprising:

an IC socket on which an IC under test is to be mounted;

signal paths including drivers respectively, each applying a calibration pulse to said IC socket;

a probe to be sequentially contacted with terminals of said IC socket to take therein a calibration pulse applied to the IC socket;

signal paths including comparating means respectively, each being connected with corresponding one of the terminals of the IC socket and being supplied through the IC socket with a calibration pulse having the reference phase generated from said probe; and timing calibration means for conforming a signal propagation time on each of said driver included signal paths to the reference value as well as conforming the applied timing of each of strobe pulses given to the comparating means to the predetermined reference phase of the calibration pulse, said timing calibration method comprising the steps of:

converting, in said IC tester, an electric signal outputted from a waveform formatter into an optical signal;

supplying said optical signal to a photoconductive element of an optically driven type driver provided in said probe; and generating the calibration pulse having the reference phase from said optically driven type driver.

9. A timing calibration method in an IC tester, said IC tester comprising:

an IC socket on which an IC under test is to be mounted;

signal paths including drivers respectively, each applying a calibration pulse to said IC socket;

a probe to be sequentially contacted with terminals of said IC socket to take therein a calibration pulse applied to the IC socket;

signal paths including comparating means respectively, each being connected with corresponding one of the terminals of the IC socket and being supplied through the IC socket with a calibration pulse having the reference phase generated from said probe; and timing calibration means for conforming a signal propagation time on each of said driver included signal paths to the reference value as well as conforming the applied timing of each of strobe pulses given to the comparating means to the predetermined reference phase of the calibration pulse, said timing calibration method comprising the steps of:

modulating, in said probe, quantity of light of a propagating light in correspondence to the amplitude value of a calibration pulse taken in said probe from said IC socket; and converting the quantity of light of the modulated optical signal transmitted to said IC tester from said probe into an electric signal; and supplying the electric signal to comparating means and conforming the timing of the calibration pulse to the timing of a strobe pulse which is to be applied to said comparating means.

* * * * *